United States Patent
Zhou et al.

(10) Patent No.: US 10,685,905 B2
(45) Date of Patent: Jun. 16, 2020

(54) MULTI-LAYER COOLING STRUCTURE INCLUDING THROUGH-SILICON VIAS THROUGH A PLURALITY OF DIRECTLY-BONDED SUBSTRATES AND METHODS OF MAKING THE SAME

(71) Applicant: Toyota Motor Engineering & Manufacturing North America, Inc., Erlanger, KY (US)

(72) Inventors: Feng Zhou, South Lyon, MI (US); Ki Wook Jung, Santa Clara, CA (US); Ercan M. Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 15/879,183

(22) Filed: Jan. 24, 2018

(65) Prior Publication Data
US 2019/0229037 A1  Jul. 25, 2019

(51) Int. Cl.
*H01L 23/473* (2006.01)
*H01L 23/498* (2006.01)
(Continued)

(52) U.S. Cl.
CPC .......... *H01L 23/473* (2013.01); *H01L 21/486* (2013.01); *H01L 21/4857* (2013.01);
(Continued)

(58) Field of Classification Search
CPC . H01L 23/473; H01L 21/4857; H01L 21/486; H01L 23/49833; H01L 23/49838; H01L 23/4735; H01L 23/3677
See application file for complete search history.

(56) References Cited

U.S. PATENT DOCUMENTS 7,414,843 B2 * 8/2008 Joshi ................ F28F 3/08
165/104.33
7,486,710 B2 * 2/2009 Kan .................. H01L 23/473
372/34
(Continued)

FOREIGN PATENT DOCUMENTS

CN  101834159 B  8/2012
JP    6119352 B2  4/2017

OTHER PUBLICATIONS

Green et al., A Review of Two-Phase Forced Cooling in Three-Dimensional Stacked Electronics: Technology Integration; http://electronicpackaging.asmedigitalcollection.asme.org/article.aspx?articleid=2469021.

(Continued)

*Primary Examiner* — Allen L Parker
*Assistant Examiner* — Charles N Ausar-El
(74) *Attorney, Agent, or Firm* — Dinsmore & Shohl LLP (57) ABSTRACT

A multi-layer cooling structure comprising a first substrate layer comprising an array of cooling channels, a second substrate layer comprising a nozzle structure that includes one or more nozzles, an outlet, and an outlet manifold, a third substrate layer comprising an inlet manifold and an inlet, and one or more TSVs disposed through the first substrate layer, second substrate layer, and third substrate layer. At least one of the one or more TSVs is metallized. The first substrate layer and the second substrate layer are directly bonded, and the second substrate layer and the third substrate layer are directly bonded.

16 Claims, 7 Drawing Sheets

(51) Int. Cl.
  *H01L 21/48*   (2006.01)
  *H01L 23/367*  (2006.01)
  *H01L 23/373*  (2006.01)
(52) U.S. Cl.
  CPC ...... *H01L 23/3677* (2013.01); *H01L 23/4735* (2013.01); *H01L 23/49833* (2013.01); *H01L 23/49838* (2013.01); *H01L 23/3738* (2013.01)

(56) References Cited

U.S. PATENT DOCUMENTS

| | | | |
|---|---|---|---|
| 8,106,505 B2* | 1/2012 | Bernstein | H01L 23/473 |
| | | | 257/713 |
| 8,541,819 B1* | 9/2013 | Or-Bach | H01L 29/7841 |
| | | | 257/211 |
| 8,546,930 B2 | 10/2013 | Muhannad et al. | |
| 8,828,797 B2 | 9/2014 | Coudrain et al. | |
| 8,883,637 B2 | 11/2014 | Jeng et al. | |
| 8,970,050 B2 | 3/2015 | Lee | |
| 9,355,933 B2 | 5/2016 | Ching et al. | |
| 9,666,523 B2 | 5/2017 | Wood | |
| 9,754,921 B2 | 9/2017 | Park et al. | |
| 9,970,718 B2* | 5/2018 | Lin | F28F 13/08 |
| 2009/0130821 A1* | 5/2009 | Cox | H01L 23/544 |
| | | | 438/455 |
| 2011/0215457 A1 | 9/2011 | Park | |
| 2012/0193788 A1* | 8/2012 | Fu | H01L 21/76898 |
| | | | 257/738 |
| 2015/0156862 A1* | 6/2015 | Scannel | H05K 1/0206 |
| | | | 174/252 |
| 2017/0018478 A1* | 1/2017 | Maple | H01L 23/367 |
| 2017/0018501 A1* | 1/2017 | Maple | H01L 23/5283 |
| 2017/0179001 A1* | 6/2017 | Brunschwiler | H01L 23/473 |
| 2019/0181717 A1* | 6/2019 | Zhou | H02K 5/20 |

OTHER PUBLICATIONS

Gambino, J.P., Adderly, S.A., and Knickerbocker, J.U., An overview of through-silicon-via technology and manufacturing challenges. Microelectronic Engineering, 2015. 135: p. 73-106.

Dede, E M. et al., Concepts for embedded cooling of vertical current wide band-gap semiconductor devices. in 2017 16th IEEE Intersociety Conference on Thermal and Thermomechanical Phenomena in Electronic Systems (ITherm). 2017.

* cited by examiner

MULTI-LAYER COOLING STRUCTURE INCLUDING THROUGH-SILICON VIAS THROUGH A PLURALITY OF DIRECTLY-BONDED SUBSTRATES AND METHODS OF MAKING THE SAME

TECHNICAL FIELD

The present specification generally relates to multi-layer cooling structures and, more specifically, to multi-layer cooling structures including through-silicon vias through a plurality of directly-bonded wafer substrates and methods of making the same.

BACKGROUND

Heat sinking devices may be coupled to a heat generating device, such as a semiconductor or other power electronics device, to remove heat and lower the operating temperature of the heat generating device. Heat may be convected to cooling fluid and removed from the device. For example, a jet of cooling fluid may be directed such that it impinges a surface of the heat generating device. Another way to remove heat from a heat generating device is to couple the device to a finned heat sink made of a thermally conductive material, such as aluminum.

However, current heat sinking devices may be inadequate for current power semiconductor applications. Current heat sinking devices and other cooling structures may require layers of interface material, such as thermal interface material, that might increase thermal resistance substantially. This may make thermal management of the power electronics device more challenging. In some instances, additional layers may be removed by directly bonding one or more substrate layers.

SUMMARY

In one embodiment, a multi-layer cooling structure includes a first substrate layer comprising an array of cooling channels, a second substrate layer comprising a nozzle structure that includes one or more nozzles, an outlet, and an outlet manifold, a third substrate layer comprising an inlet manifold and an inlet, and one or more TSVs disposed through the first substrate layer, second substrate layer, and third substrate layer. At least one of the one or more TSVs is metallized. The first substrate layer and the second substrate layer are directly bonded, and the second substrate layer and the third substrate layer are directly bonded.

In another embodiment, a multi-layer cooling structure that is thermally coupled to a semiconductor device includes a first substrate layer, a second substrate layer, and a third substrate layer, a first metallization pad coupled to a top surface of the first substrate layer and a second metallization pad coupled to a bottom surface of the third substrate layer, and one or more TSVs disposed through the first substrate layer, second substrate layer, and third substrate layer. At least one of the one or more TSVs is metallized. The first substrate layer and the second substrate layer are directly bonded, the second substrate layer and the third substrate layer are directly bonded, and the one or more TSVs electrically couple the first metallization pad and the second metallization pad.

In yet another embodiment, a method of fabricating a multi-layer cooling structure comprising one or more TSVs through a first substrate layer that comprises an array of cooling channels, a second substrate layer that comprises a nozzle structure, and a third substrate layer for thermally coupling to and cooling a semiconductor device, includes etching a cooling fluid inlet and a cooling fluid outlet on the third substrate layer, etching one or more through-holes through the first substrate layer, the second substrate layer, and the third substrate layer, aligning the one or more through-holes of the first substrate layer, the second substrate layer, and the third substrate layer, directly bonding the first substrate layer to the second substrate layer and the second substrate layer to the third substrate layer and depositing a metallization layer in the one or more through-holes to form a TSV.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Vertical integration between multiple distinct layers in a single silicon die may be accomplished using one or more through-silicon vertical interconnect accesses ("through-silicon vias" or simply "TSVs"). A TSV may be formed by etching a hole through one or more layers of silicon wafer, coating the surfaces of the hole with an insulating layer, coating the insulating layer with a diffusion barrier layer, and filling the hole with an electrically conductive metal, such as, without limitation, copper or tungsten. The holes in the silicon wafers may be formed prior to stacking the wafers, after the wafers have been stacked into a three-dimensional array, or some combination of the two. TSVs may be used to pass electrical signals and/or current between dies through one or more components of a device package. For example, TSVs may be formed in an embedded chip-scale cooler to electrically couple dies on opposing sides of the embedded chip-scale cooler.

Maintaining the alignment of the various corresponding features of components in multi-layer structures may be difficult given the high aspect ratios of the vertical etchings that are made through each substrate. The etchings may be made, for example, to provide clearance for the one or more TSVs. The aspect ratio of a TSV is the ratio of the height (or depth) of the TSV to its width. Some TSVs have an aspect ratio of 100:1, that is they may be on the order of 100-150 microns deep and only 1-5 microns wide. Hence, it may be challenging to fill the etched TSVs with an electrically conductive material. For example, TSVs may be incompletely filled or be subject to void formation during metallic deposition due to a number of problems.

For example, in multi-layer substrates, if one or more of the substrate layers is misaligned, the deposited metal that forms the TSV may not form a continuous connection from one side of the multi-layer substrate to the other, preventing current or other electrical signals from propagating through the multi-layer substrate. Other problems such as the tapering of etched holes near the boundaries of a particular TSV may cause one or more of the insulation, seed, or metallization layers deposited during formation of the one or more TSVs to be misaligned. Accordingly, a multi-layer cooling structure having one or more directly bonded substrate layers that include one or more alignment margins through multiple layers may be desired.

Figure 1:
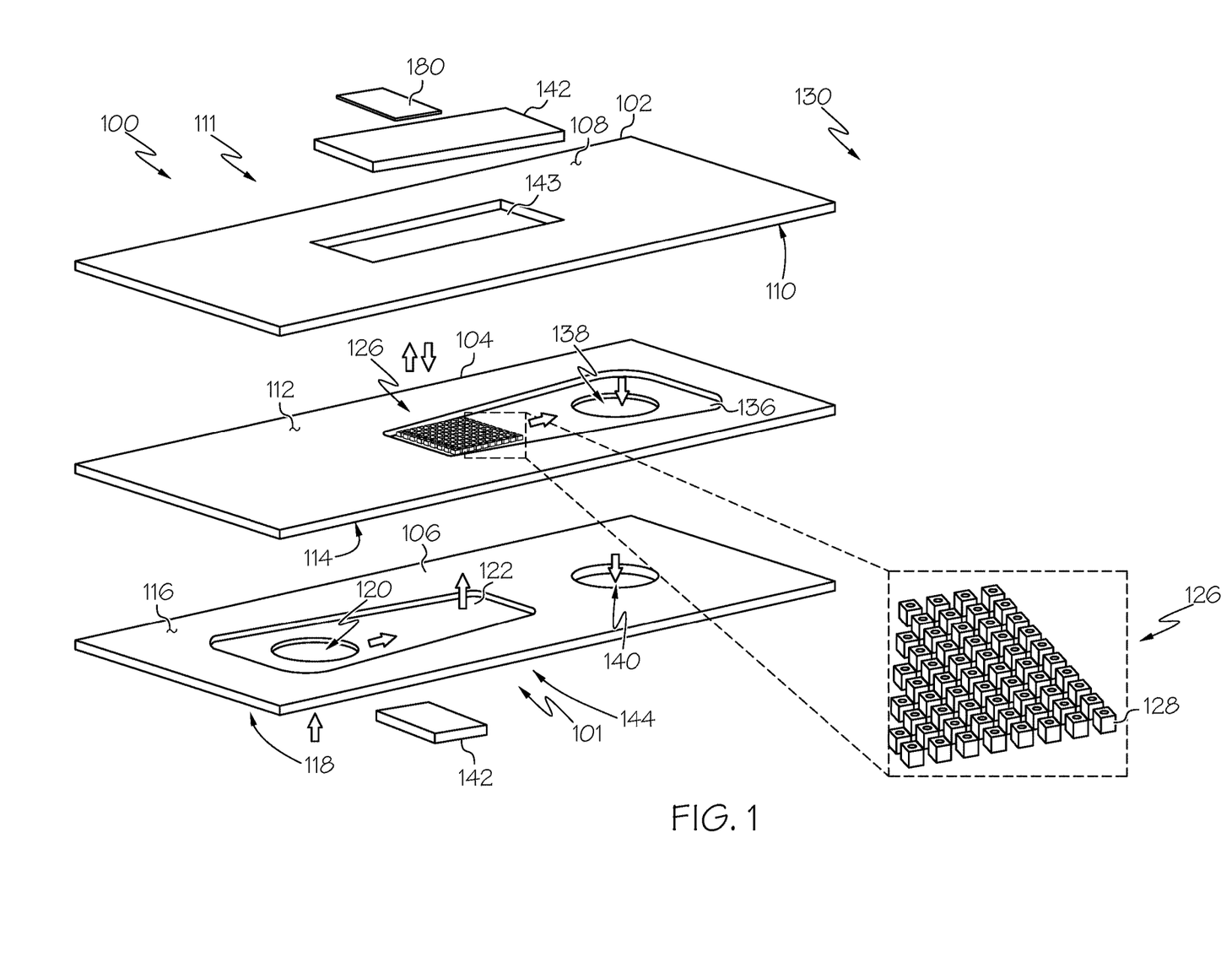
FIG. 1 depicts an example multi-layer cooling structure having a plurality of nozzles and an array of cooling channels, according to one or more embodiments shown and described herein.
Figure 2:
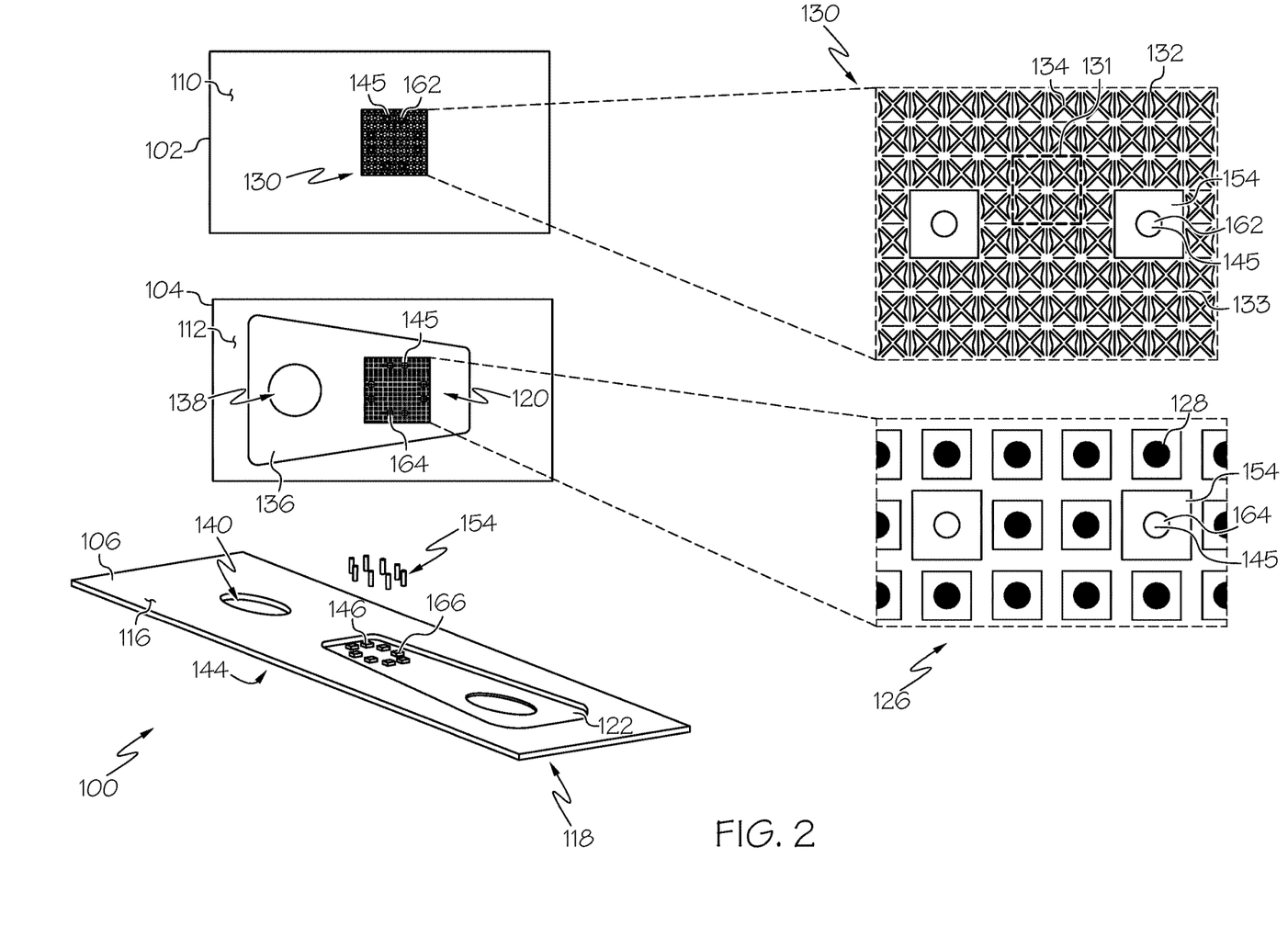
FIG. 2 depicts the example multi-layer cooling structure of FIG. 1 further incorporating one or more TSVs into the array of cooling channels, according to one or more embodiments shown and described herein.

Referring now to FIGS. 1 and 2, an example multi-layer cooling structure 100 is shown. FIG. 1 depicts a cooling fluid flow path 101 that is formed by etching various structures into the various layers of the multi-layer cooling structure 100 as will be described in greater detail below. FIG. 2 depicts examples of the structures shown in FIG. 1 in greater detail by showing the individual surfaces of the multi-layer cooling structure separately as will be described below.

The multi-layer cooling structure 100 may incorporate TSVs 145 as shown in FIG. 2 or may not incorporate TSVs as shown in FIG. 1. It should be understood that the multi-layer cooling structure 100 shown in FIGS. 1 and 2 is for illustrative purposes only and that the TSVs 145 formed through multiple layers of substrates may be disposed in any multi-layer silicon device. The multi-layer cooling structure 100 may comprise a cooling fluid flow path 101 that may comprise features that are etched into a first substrate layer 102, a second substrate layer 104, and a third substrate layer 106. The first substrate layer 102 includes a top surface 108 and a bottom surface 110. One or more semiconductor devices 180 may couple to the top surface 108 at a cooling location 111. The semiconductor device 180 may be coupled to the top surface 108 at a metallization pad 142. As shown in FIG. 2, an array 130 of cooling channels 132 may be disposed on the bottom surface 110 of the first substrate layer 102.

Referring to both FIGS. 1 and 2, the one or more semiconductor devices 180 may comprise a semiconductor material, for example, a Si semiconductor material, a SiC semiconductor material, a GaN semiconductor material, other wide bandgap semiconductor materials, or the like. Such semiconductor materials may be used, for example, to make one or more inverter circuits. Such inverter circuits may be used, for example, to power an electrified vehicle. In some embodiments, the semiconductor device may comprise an insulated-gate bi-polar transistor ("IGBT"), a metal-oxide-semiconductor field-effect transistor ("MOSFET") or any other semiconductor device. Further, as a non-limiting example, the semiconductor device may operate at temperatures between about 250° C. and about 350° C. It should be understood that other operation temperatures are possible.

As shown in the inset to FIG. 2, the array 130 of cooling channels 132 may comprise a plurality of cooling cells 131 arranged in a pattern on the bottom surface 110 of the first substrate layer 102. The cooling cells 131 may be interconnected through the one or more cooling channels 132 and each comprise an impingement region 133 where cooling fluid is impinged as described in greater detail below. The array 130 may also include a cooling fluid drain 134. The cooling fluid drain 134 may form a perimeter of the array 130 of cooling channels 132 or be incorporated into each individual cooling cell 131. The cooling fluid drain 134 may drain cooling fluid from the cooling channels 132 back into an outlet manifold 136 on the second substrate layer 104. The array 130 may be formed by a variety of manufacturing processes including, for example, etching. The array 130 of cooling channels 132 may be etched into the silicon coincidentally or separately from the other features that are etched in the silicon substrates as described herein.

The cooling channels 132 may be defined by a plurality of heat transfer layer fins of different shapes and sizes. The cooling channels 132 may comprise curved walls and be geometrically optimized to reduce pressure drop, enhance heat transfer, and direct the cooling fluid toward the cooling fluid drain 134 such that it may be routed toward the outlets 138, 140. The geometric configuration of the cooling channels 132 may be determined by computer simulation, for example. The geometric configuration of the cooling channels 132 may depend on parameters such as flow resistance, the type of cooling fluid, and the desired maximum operating temperature of the semiconductor device 180.

Still referring to FIGS. 1 and 2, the one or more semiconductor devices 180 may be thermally coupled to the array 130 of cooling channels 132 through one or more metallization pads 142. The metallization pad 142 may be positioned between the one or more semiconductor devices 180 and the first substrate layer 102. The metallization pad 142 may exhibit a relatively high heat transfer coefficient. Other devices or layers may be placed between the semiconductor device 180 and the array 130 of cooling channels 132 to manipulate the heat transfer properties from the semiconductor device 180. For example, a layer of thermal interface material (TIM) may be placed between the metallization pad 142 and the semiconductor device 180 or between the first substrate layer 102 and the metallization pad 142 to decrease the thermal resistance between the metallization pad 142 and the semiconductor device 180 or between the first substrate layer 102 and the metallization pad 142, respectively. Any type of TIM may be used, for example thermal grease, thermal glue, thermal gap filler, a thermal pad, and/or a thermal adhesive. The metallization pad 142 and/or TIM between the semiconductor device 180 and the array 130 may reduce the heat transfer resistance between the semiconductor device 180 and the cooling fluid, allowing more heat to be convected to the cooling fluid passing through the array 130, thus reducing the overall temperature of the semiconductor device 180.

The second substrate layer 104 may include a top surface 112 and a bottom surface 114. In some embodiments, the top surface 112 of the second substrate layer 104 may be directly bonded to the bottom surface 110 of the first substrate layer 102. As used herein, the term "directly bonded" or a "direct bond" (also referred to as "silicon direct bonded" or "silicon fusion bonded") means a bond between layers of silicon substrate, such as the first substrate layer 102 and the second substrate layer 104, without an additional layer between the two layers. The silicon direct bond may be based on intermolecular interactions including van der Waals forces, hydrogen bonds, and strong covalent bonds.

The second substrate layer 104 may comprise Si, for example. An outlet manifold 136 may be etched in the top surface 112 of the second substrate layer 104. The bottom surface 110 of the first substrate layer 102 may form an upper boundary of the outlet manifold 136 and the outlet manifold 136 may include an outlet 138. The outlet 138 may be a hole etched through the entire thickness of the second substrate layer 104.

A nozzle structure 126 may be positioned on the second substrate layer 104 opposite the array 130 of cooling channels 132 on the bottom surface 110 of the first substrate layer 102. As shown in the nozzle structure inset to FIG. 1, the nozzle structure 126 may include one or more nozzles 128 that pass through the width of the second substrate layer 104. The nozzles 128 may be integrally formed as hollow cylinders, for example. The one or more nozzles 128 may be formed by an etching process to achieve the desired shape and configuration. Some embodiments of the multi-layer cooling structure 100 do not include the nozzle structure 126 on the second substrate layer 104 and the nozzle structure 126 may be replaced by some other feature or features, such as a cooling fluid inlet (i.e., a hole through the second substrate layer 104).

The third substrate layer 106 may include a top surface 116 and a bottom surface 118. In some embodiments, the top surface 116 of the third substrate layer may be directly bonded to the bottom surface 114 of the second substrate layer 104. The third substrate layer 106 may comprise Si, for example.

An inlet manifold 122 may be etched in the top surface 116 of the third substrate layer 106 that includes an inlet 120 through the thickness of the third substrate layer 106. The bottom surface 114 of the second substrate layer 104 may form an upper boundary of the inlet manifold 122, thus containing cooling fluid within the cooling fluid flow path 101. The inlet manifold 122 may be in fluid communication with the one or more nozzles 128 of the nozzle structure 126. The third substrate layer 106 may also include an outlet 140. The outlet 140 may be concentric and sized correspondingly to the outlet 138 of the second substrate layer 104.

Cooling fluid may generally flow along the cooling fluid flow path 101 from the inlet 120, to the inlet manifold 122, to the one or more nozzles 128 of the nozzle structure 126, where it may be impinged on the one or more cooling channels 132 of the array 130. The cooling fluid flows through the cooling channels 132 to the cooling fluid drain 134, to the outlet manifold 136 and then out the outlets 138, 140 where it may connect to another system or be recirculated. For example, the warmed cooling fluid may be cooled in a secondary recirculation loop, such as an automotive radiator, or be stored in a cooling fluid reservoir. The multi-layer cooling structure 100 may include a micro-pump or some other mechanism for imparting pressure to the flow path 101 causing the cooling fluid to flow as described herein.

The cooling fluid may comprise, as one example, deionized water. Other exemplary fluids include, without limitation, water, organic solvents, and inorganic solvents. Examples of such solvents may include commercial refrigerants such as R-134a, R717, and R744. Moreover, in some embodiments, the cooling fluid may be a dielectric cooling fluid. Non-limiting dielectric cooling fluids include R-245fa and HFE-7100. The type of cooling fluid chosen may depend on the operating temperature of the one or more semiconductor devices 180 to be cooled. Further, selection of the composition of the cooling fluid used in association with the multi-layer cooling structure 100 may be selected based on, among other properties, the boiling point, the density, and the viscosity of the cooling fluid.

In operation, heat flux generated by the one or more semiconductor devices 180 coupled to the top surface 108 of the first substrate layer 102 is transferred to the array 130 of cooling channels 132 through the first substrate layer 102. As described above, the first substrate layer 102 may comprise one or more structures between the array 130 and the one or more semiconductor devices 180 to alter the thermal resistance between the array 130 and the one or more semiconductor devices 180. Thus, heat generated by the one or more semiconductor devices 180 may be conducted through the metallization pads 142 or other TIM where it is convected to the cooling fluid at the array 130 of cooling channels 132.

Cooling fluid may be impinged on the one or more impingement regions 133 of the array 130 as a jet flowing upward from the one or more nozzles 128 after passing through the inlet 120 and inlet manifold 122. In some embodiments, the cooling fluid may change phases while passing through the one or more nozzles 128 or after it has impinged on the one or more cooling cells 131. In some embodiments, the nozzles 128 have a linear nozzle flow profile. In other embodiments, the nozzles 128 have a convergent-divergent profile, a divergent-convergent-divergent profile, or any other suitable nozzle flow profile. In alternative embodiments, the cooling fluid flow path 101 does not include a nozzle structure 126. That is, the multi-layer cooling structure 100 may not be configured as a jet impingement heat exchanger but rather as a channel-only structure wherein fluid entering the cooling channels 132 would flow around heat exchanger fins of one or more heat transfer layers. In such an embodiment, there may be one or more holes through the second substrate layer 104.

The semiconductor device 180 may comprise one or more hot spots (i.e., regions of higher temperature as compared to other regions within the semiconductor device 180) based on the particular construction of the individual semiconductor device 180. One or more of the impingement regions 133 may coincide with one or more hot spots on the semiconductor device 180 such that these areas of the one or more semiconductor devices 180 receive the impingement of cooling fluid and are thus cooled at a greater rate improving the performance of the one or more semiconductor devices 180.

After the cooling fluid is impinged on the impingement region 133 of each cooling cell 131, it remains in contact with the array 130 but changes direction to a flow direction that is normal to the jet of cooling fluid. The cooling fluid may flow radially from the center of each cooling cell 131 toward the perimeter of the cooling cell 131 through the cooling channels 132, ultimately reaching the cooling fluid drain 134. Therefore, the cooling fluid may flow over the surface of the array 130 convectively and thermally conducting heat flux from the semiconductor device 180 to the cooling fluid, simultaneously heating the cooling fluid and cooling the semiconductor device 180.

After leaving the array 130 of cooling cells 131, the cooling fluid may exit the multi-layer cooling structure 100 through the outlet manifold 136 and the outlets 138, 140. The cooling fluid may then be circulated through one or more other systems, such as, for example, one or more other multi-layer cooling structures 100 or other heat exchanger, or sent to a cooling fluid reservoir.

Referring now to FIG. 2, the multi-layer cooling structure 100 may comprise one or more TSVs 145. The TSVs 145 may pass vertically through the individual substrates of the multi-layer cooling structure 100. The location of the one or more TSVs 145 is not limited to the particular structure shown herein. The TSVs 145 may comprise an electrically conductive material 154. The electrically conductive material of the TSVs 145 may comprise, without limitation, aluminum, copper, copper oxide, graphite, brass, gold, silver, platinum, tungsten, or the other material that is suitably depositable and electrically conductive. Referring to FIGS. 1 and 2, the TSVs 145 may electrically couple the one or more metallization pads 142 through the multi-layer cooling structure 100. The metallization pads 142 may comprise any electrically conductive material such as, without limitation, copper, copper oxide, graphite, brass, silver, platinum, tungsten, or the like.

As shown in FIG. 2, in some embodiments the TSVs 145 may be comprised of one or more through-holes such as first substrate layer through-holes 162 in the array 130, second substrate layer through-holes 164 in the nozzle structure 126, and third substrate layer through-holes 166. The through-holes may pass through various other features of the individual substrates, for example, the third substrate layer through-holes 166 may be etched into one or more TSV platforms 146 in the inlet manifold 122. The one or more TSV platforms 146 may form a seal with the bottom surface of the second substrate layer 104 and prevent cooling fluid from contacting the TSVs 145 in the inlet manifold 122. The second substrate layer through-holes 164 may be etched into and pass through the nozzle structure 126. And the first substrate layer through-holes 162 may be etched into and/or pass through the array 130 of cooling channels 132. The first substrate layer through-holes 162, second substrate layer through-holes 164, and the third substrate layer through-holes 166 may be aligned form the TSVs 145 when the first, second, and third substrate layers 102, 104, 106 are directly bonded.

The third substrate layer 106 of the example multi-layer cooling structure 100 shown in FIG. 2 has eight TSV platforms 146 corresponding to eight TSVs 145 in the multi-layer cooling structure 100. However, it is contemplated that any number of TSVs 145 may be provided. For example, without limitation, other embodiments of the multi-layer cooling structure may have one, two, three, or four TSVs 145. FIG. 2 shows example embodiments of the array 130 of cooling channels 132 and the nozzle structure 126 having TSVs 145 (illustrated by electrically conductive material 154) passing through portions of the array 130 and the nozzle structure 126. The TSVs 145 may be formed in the array 130, the nozzle structure 126, and/or the various substrate layers of the multi-layer cooling structure 100 as described below. The TSV platforms 146 may be aligned with the TSVs 145 passing through the multiple substrate layers. Additionally, it is contemplated that the one or more TSVs 145 may be located outside the inlet manifold 122 and/or outside the outlet manifold 136.

The TSVs 145 may electrically couple the one or more semiconductor devices 180 on opposite sides of the multi-layer cooling structure 100. In some embodiments, the TSVs 145 couple the one or more semiconductor devices 180 or other devices through the metallization pads 142 on the top surface of the first substrate layer 102 and the bottom surface 118 of the third substrate layer 106 (as shown in FIG. 1). The TSVs 145 may pass either current or electrical signals. In some embodiments, the TSVs 145 electrically couple the one or more metallization pads 142. The first, second, and third substrate layer through-holes 162, 164, 166 that serve as conduits for the one or more TSVs 145 may be formed in the one or more substrates of the multi-layer cooling structure 100 as described herein.

Referring now to FIGS. 3-6, non-limiting, example processes of etching and forming various features of the multi-layer cooling structure 100 will now be described. The various features of the multi-layer cooling structure 100 may be formed by etching features into the first, second, and third substrate layers 102, 104, 106 and then directly bonding the first, second, and third substrate layers 102, 104, 106. In alternative embodiments, the first, second, and third substrate layers 102, 104, 106 may first be bonded and then the features may be etched. The first, second, and third substrate layers 102, 104, 106 of the multi-layer cooling structure 100 may be directly bonded using plasma activated bonding, surface activated bonding, ultra high vacuum bonding, and surface activation by chemical-mechanical polishing. Prior to bonding, the surfaces of the substrate layers to be bonded should be free of impurities. The surfaces to be bonded may be treated using a plasma treatment, a UV/ozone cleaning, and/or a wet chemical cleaning procedure. The surfaces to be bonded may then be aligned as described herein. The surfaces to be bonded may then be prebonded by being placed into contact and surface molecules may begin to polymerize at room temperature. To increase the bonding strength, the substrate layers may be annealed (e.g., at high temperatures above 800 degrees Celsius) The oxide present on the surfaces of the substrate layers may turn viscous and migrate across the interface, increasing the surface area of the substrate layers in contact. This may reduce the size of interface voids or cause them to disappear entirely.

The fluid channels and other flow structures of the multi-layer cooling structure 100 may be formed by etching using a chemical etchant. For example, the inlet 120, inlet manifold 122, one or more nozzles 128, cooling channels 132, cooling fluid drain 134, outlet manifold 136, outlet 138, and outlet 140 may be formed by etching the first, second, and third substrate layers 102, 104, 106. Further, in some embodiments the cooling channels 132 may comprise uniform pin fin arrays, non-uniform pin fin arrays, straight channels, wavy channels, or channels comprising any cross-sectional shape, pathway shape, or pathway topology that are etched into the various substrate layers of the multi-layer cooling structure 100.

Figure 3:
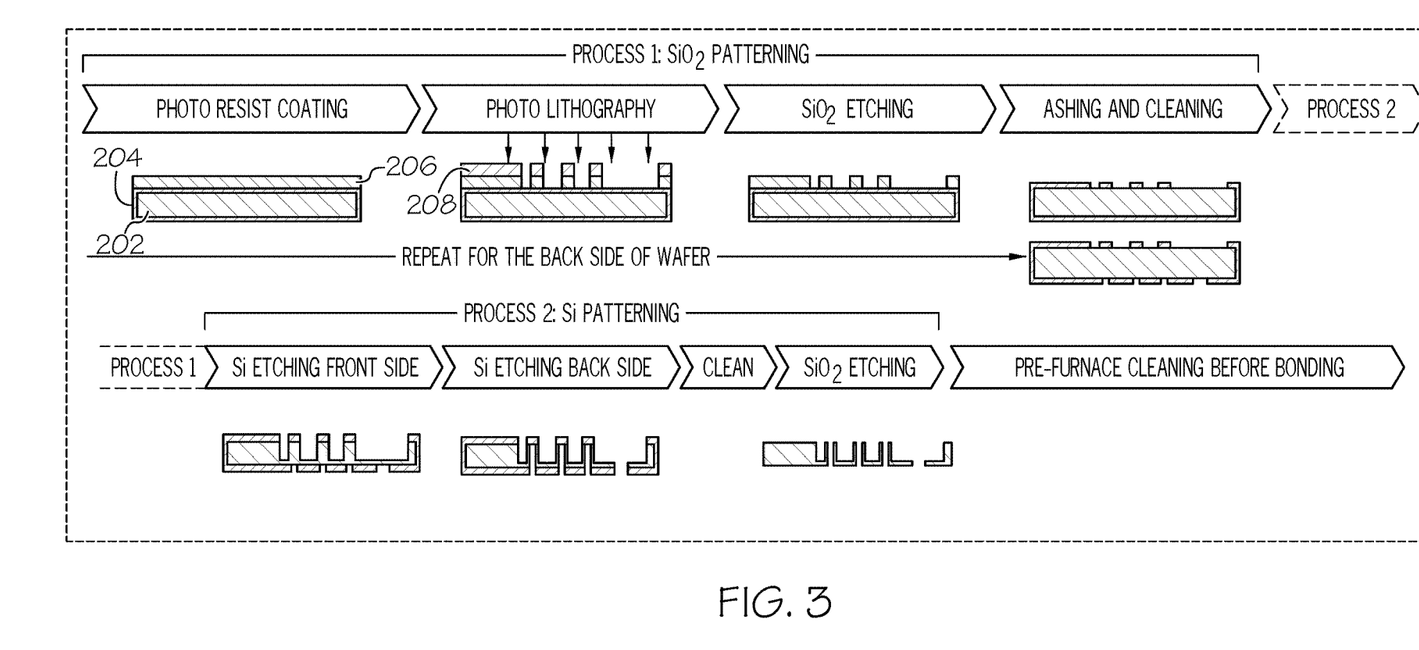
FIG. 3 depicts a flowchart of a patterning process for forming the example multi-layer cooling structure of FIG. 1, according to one or more embodiments shown and described herein.

FIG. 3 schematically illustrates a non-limiting example process of patterning the various substrates of the multi-layer cooling structure 100 to form its various features. It should be understood that other etching processes for patterning the multi-layer cooling structure 100 may be utilized. FIG. 3 specifically depicts a process of $SiO_2$ patterning using photolithography, but any process for patterning a silicon wafer may be used. As shown in FIG. 3, a silicon wafer 202 having a silicon-oxide ($SiO_2$) coating 204 is coated with a layer of photo resist 206. The photo resist may be a viscous solvent, for example. The layer of photo resist 206 may be applied by spin coating. The layer of photo resist 206 may be of uniform thickness or of varying thickness. The layer of photo resist may be between 0.5 and 5 microns thick, for example. After the layer of photo resist 206 has been applied the substrate may be prebaked to remove excess photo resist.

In some embodiments, a mask layer 208 may be placed over the layer of photo resist 206. The mask layer 208 may be a transparent fused silica bank having a pattern appropriate for the feature or features to be etched into the substrate. After the photo resist layer 206 and/or the mask layer 208 have been applied, the external layers are exposed to intense light and a developer solution. The developer solution may be applied similarly to the photo resist layer 206, i.e., using a spin coating. The areas of the photo resist layer 206 that are not covered by the mask layer 208 may dissolve exposing one or more portions of the $SiO_2$ coating 204.

A chemical etchant is then used to etch the $SiO_2$ layer 204 exposing the silicon wafer 202. The etchant may be a wet or a dry chemical etchant. The etching process may be isotropic or anisotropic in nature. Additionally, the excess photo resist layer 206 may be removed in an ashing process. The ashing process may include using a resist stripper to remove the excess photo resist or an equivalent process, such as, for example, a plasma oxidation process.

The process of applying a photo resist and/or masking layer, etching the substrate, and removing the photo resist and/or masking layer may be repeated on the back side of the wafer where appropriate. As shown in FIG. 3, once one side or both sides of the $SiO_2$ layer 204 of the substrate have been patterned the silicon itself may be etched using similar processes to those described above. The $SiO_2$ layer 204 may be eventually removed from the substrate leaving the substrate ready for bonding with other substrate layers or otherwise ready to be used in a structure such as, for example, the multi-layer cooling structure 100.

Figure 4:
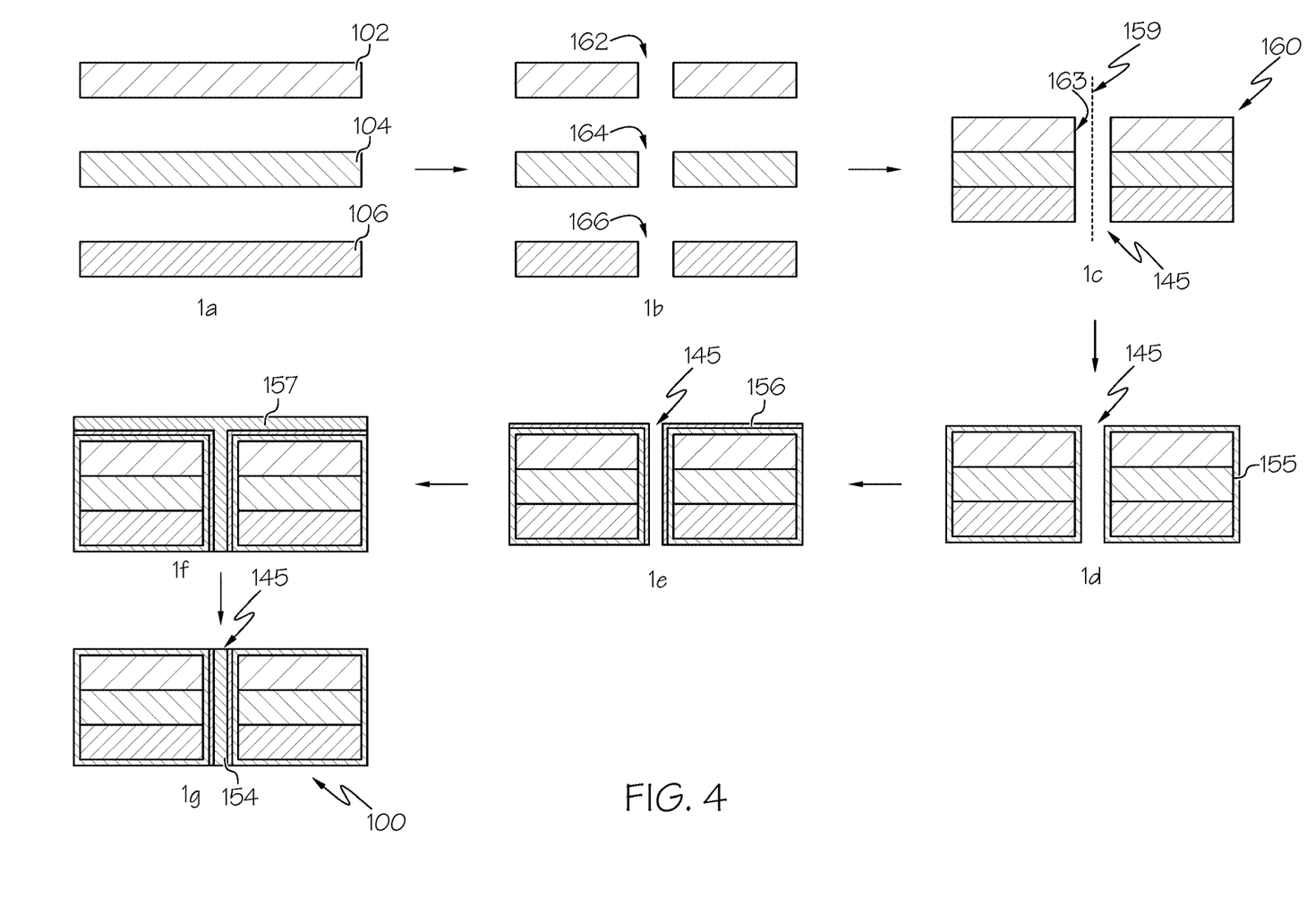
FIG. 4 schematically depicts a first example process for incorporating a TSV into the example multi-layer cooling structure of FIG. 1, according to one or more embodiments shown and described herein.

FIG. 4 shows one example of a method for forming a substrate assembly, such as the multi-layer cooling structure 100 depicted in FIG. 1, for example. The multi-layer cooling structure 100 is formed by bonding the first, second, and third substrate layers 102, 104, 106. The first, second, and third substrate layers 102, 104, 106 are arranged for bonding in step 1a. The first, second, and third substrate layers 102, 104, 106 are etched using an etching process as described above or similar at step 1b. One or more first substrate layer through-holes 162, second substrate layer through-holes 164, and third substrate layer through-holes 166 for the TSVs 145 and/or other patterns may be etched into each of the first, second, and third substrate layers 102, 104, 106 individually.

The first, second, and third substrate layer through-holes 162, 164, 166 may include a TSV sidewall 163. The TSV sidewall 163 may define a circular boundary around the first, second, and third substrate layer through-holes 162, 164, 166. In some embodiments, the TSV sidewall 163 defines a shape besides a circle, for example, a square, a rectangle, or a triangle. The first, second, and third substrate layer through-holes 162, 164, 166 and/or TSVs 145 may each comprise a common TSV axis 159. In some embodiments, the one or more first, second, and third substrate layer through-holes 162, 164, 166 and the one or more TSVs 145 share a common TSV axis 159, but embodiments are not so limited.

As a non-limiting example, the various substrate layers and features of the multi-layer cooling structure 100 may be aligned utilizing a machine vision system and/or machine vision to align the substrate layers. The machine vision system may comprise one or more optical or infrared cameras designed to detect one or more fiducial marks on the substrate layers and/or one or more visual or infrared light sources to illuminate the one or more fiducial marks in visual or infrared light. The visual or infrared light source may illuminate the one or more fiducial marks to increase the contrast of the fiducial mark from the substrate layer or other feature where the fiducial mark is located.

The machine vision systems may incorporate the one or more fiducial marks to automatically and precisely align the layers and features. The fiducial mark or marks may comprise one or more opaque or other markings on a surface or other feature of a substrate layer and a real-time image capture of the fiducial mark may be compared to a reference image to align the substrate layer or layers and the features thereon.

After the first, second, and third substrate layer through-holes 162, 164, 166 have been etched into the first, second, and third substrate layers 102, 104, 106 individually, the substrate layers are bonded together to form the multi-layer substrate 160. The first, second, and third substrate layers 102, 104, 106 may be bonded by soldering, sintering, brazing, using transient liquid phase bonding (TLP), anodic bonding, or any other known or yet-to be developed bonding method.

In some embodiments, insulation and passivation layer 155 (e.g. $SiO_2$, SiN, etc.) may then be deposited on the external surfaces of the multi-layer substrate 160 at step 1d. The insulation and passivation layer 155 may be deposited using any deposition technique such as sputtering, atomic layer deposition (ALD), chemical vapor deposition (CVD), physical vapor deposition (PVD), such as PVD magnetron sputtering, etc. The insulation and passivation layer 155 may be a layer comprised of, for example, silicon nitride or other material displaying similar properties. The insulation and passivation layer 155 may prevent electrical signal or current from diffusing from the one or more TSVs 145 to the silicon wafers that form the body of the first, second, and third substrate layers 102, 104, 106. The insulation and passivation layer 155 may be continuous or discontinuous through the entire TSV 145.

Referring once again to FIG. 4, a seed layer 156 for metal deposition is applied on top of the insulation and passivation layer 155, at step 1e. The seed layer 156 may be deposited using any deposition technique such as sputtering, atomic layer deposition (ALD), chemical vapor deposition (CVD), physical vapor deposition (PVD), such as PVD magnetron sputtering, etc. The seed layer 156 may help achieve specifically patterned growth of the electrode layer or TSV 145. That is, the atomic structural pattern of the seed layer 156 may provide a template for the growth of a metallization layer 157. The seed layer 156 may be continuous or discontinuous through the first, second, and third substrate layer through-holes 162, 164, 166. As shown in FIG. 4, the seed layer 156 may be deposited within the TSV 145 and on the top surface of the multi-layer substrate 160 or within the first, second, and third substrate layer through-holes and on the top and bottom surfaces of the multi-layer substrate 160.

After the seed layer 156 is applied, the metallization layer 157 is deposited to form the TSV 145 at step 1f. The metallization layer 157 is a layer of electrically conductive, depositable metal, such as, without limitation, copper, tungsten, aluminum, copper oxide, graphite, brass, gold, silver, or platinum. The metallization layer 157 may be deposited using any deposition technique such as sputtering, atomic layer deposition (ALD), chemical vapor deposition (CVD), physical vapor deposition (PVD), etc. The top surface of the metallization layer 157 is polished using, for example, a chemical mechanical polish (CMP), until the only metal left is inside the TSV 145.

The method depicted in FIG. 4 gives the advantage of relatively easy etching of TSVs 145 because each of the substrate layers is etched individually. This lowers the aspect ratio of the etch. Briefly referring to FIG. 7B, the through-holes in each of the substrate layers 102, 104, 106 may be etched using the process depicted in FIG. 4 with a different radius in each of the layers to provide a specific radial pattern along the height of the TSV 145. For the purposes of this application, a specific radial pattern refers to a pattern of varying radii between the various substrate layers in which the first substrate layer 102 may have the largest diameter and the third substrate layer 106 may have the smallest diameter. The substrate layers 102, 104, 106 may then be directly bonded to create the specific radial pattern shown in FIG. 7B.

Figure 5:
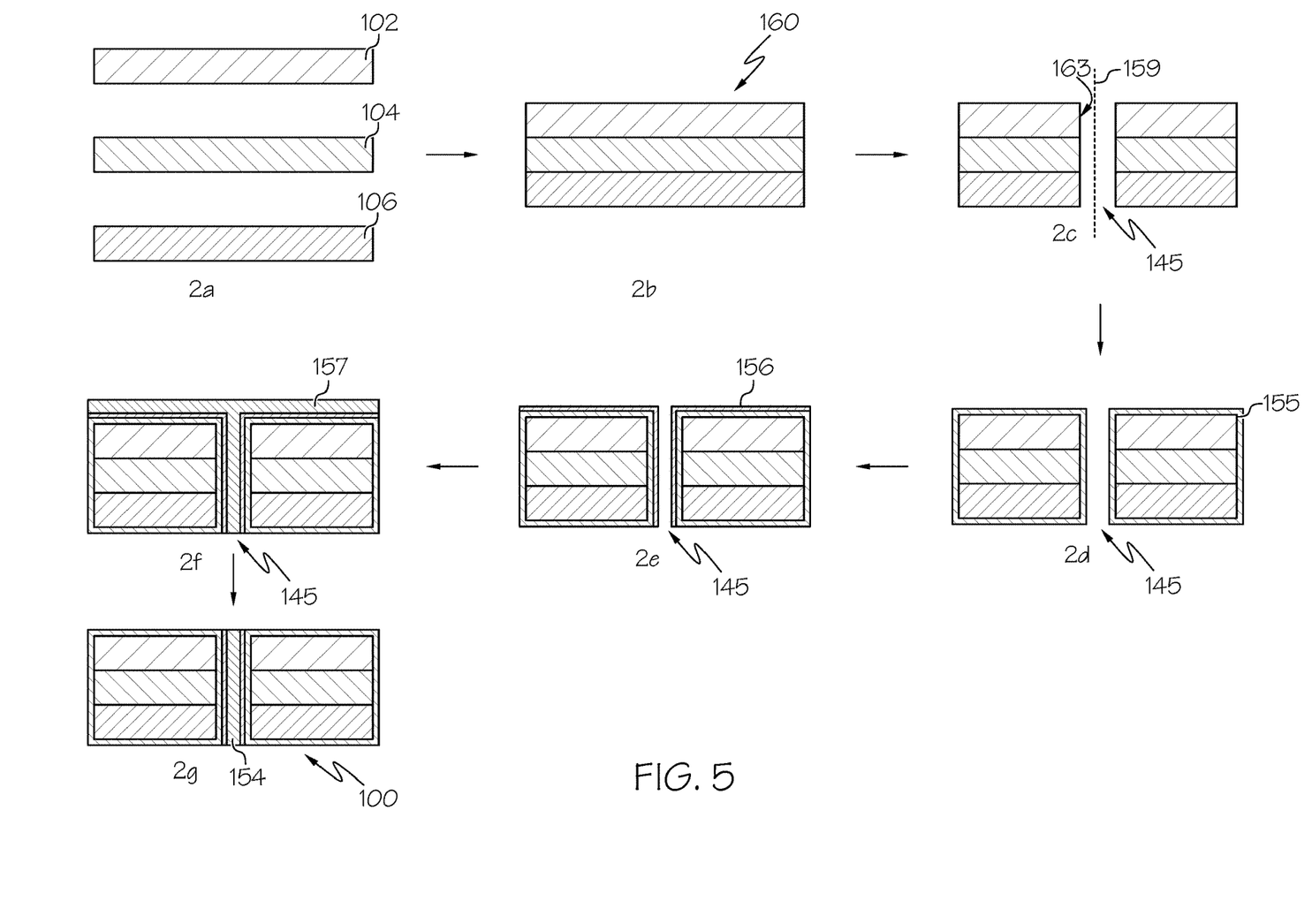
FIG. 5 schematically depicts a second example process for incorporating a TSV into the example multi-layer cooling structure of FIG. 1, according to one or more embodiments shown and described herein.

FIG. 5 schematically depicts another example method for forming a TSV 145 or other structure that passes through a multi-layer substrate 160. In this embodiment, the first, second, and third substrate layers 102, 104, 106 are bonded together before they are etched. The substrate layers are bonded at step 2b. At step 2c, the substrate layers are etched to form a hole that will become a TSV 145 after metallization. The remaining steps 2d-2g are similar to the process described above with respect to FIG. 4

Figure 7A:
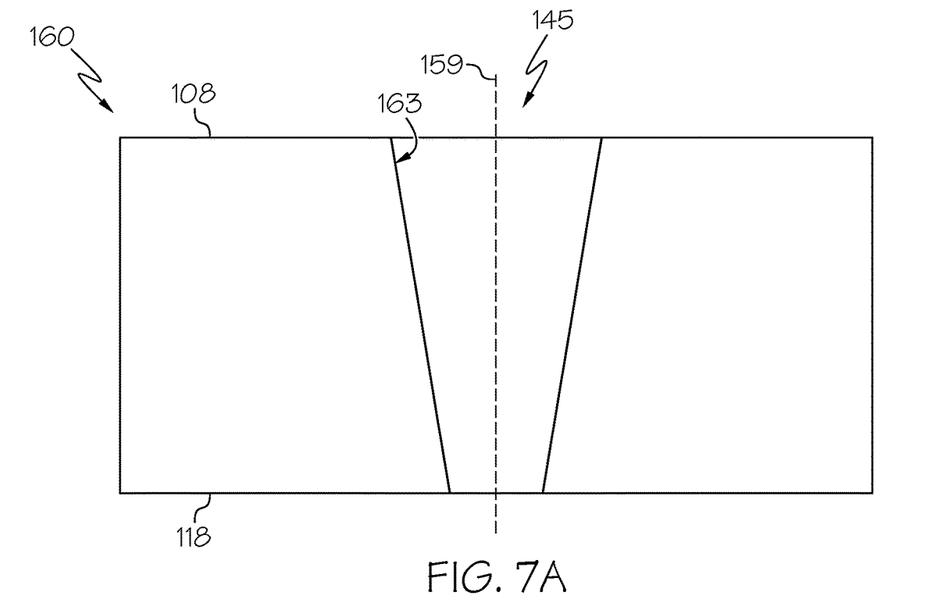
FIG. 7A depicts an example multi-layer substrate having a tapered TSV passing through the multiple layers of the substrate, according to one or more embodiments shown and described herein.
Figure 7B:
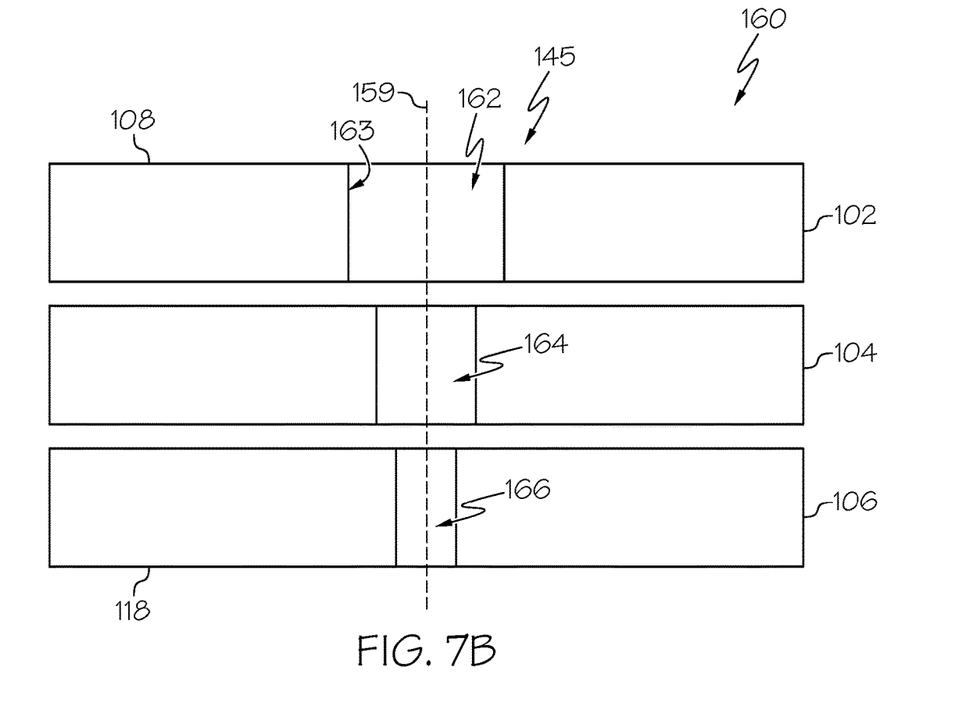
FIG. 7B depicts an example multi-layer substrate having multiple layers with holes with varying diameters passing through each layer to form a tiered TSV passing through the multiple-layer substrate, according to one or more embodiments shown and described herein.

The process depicted by FIG. 5 eliminates the need for precise alignment of the first, second, and third substrate layer through-holes 162, 164, 166 prior to bonding the substrate layers together. There may be less of a chance that electrical discontinuities or gaps will form in the TSVs 145 due to misalignment of multiple through-holes during the bonding of the various layers. Additionally, not every surface of the individual substrate layers needs to be prepared for etching, which may save time and resources in the etching process. However, the etch time required to etch a TSV with a high aspect ratio may be relatively high compared with etching multiple lower aspect ratio through-holes. Additionally, the TSV sidewalls 163 of the one or more TSVs 145 may taper in the downward direction as shown in FIGS. 7A and 7B (i.e., away from side of chemical etchant application). In some embodiments, the top and bottom edges of the TSV 145 may be subject to flaring of the TSV sidewalls.

With brief reference to FIG. 7A, the process depicted in FIG. 5 may result in through-holes that are tapered along the length of the through-hole from the top of the TSV 145 to the bottom of the TSV 145. Specifically, the radius of the TSV sidewall 163 may decrease along a height of the TSV 145 from the top surface 108 of the first substrate layer 102 to the bottom surface 118 of the third substrate layer 106. The taper may be due to the chemical etchant having a greater effect at the top of the TSV 145 than at the bottom. Additionally, one or more features of the various substrate layers that are etched but not metallized, for example, the one or more nozzles 128, may also be subject to this effect. In the case of the nozzles 128 this may be advantageous as it may create a natural diffuser through the multiple substrate layers.

Figure 6:
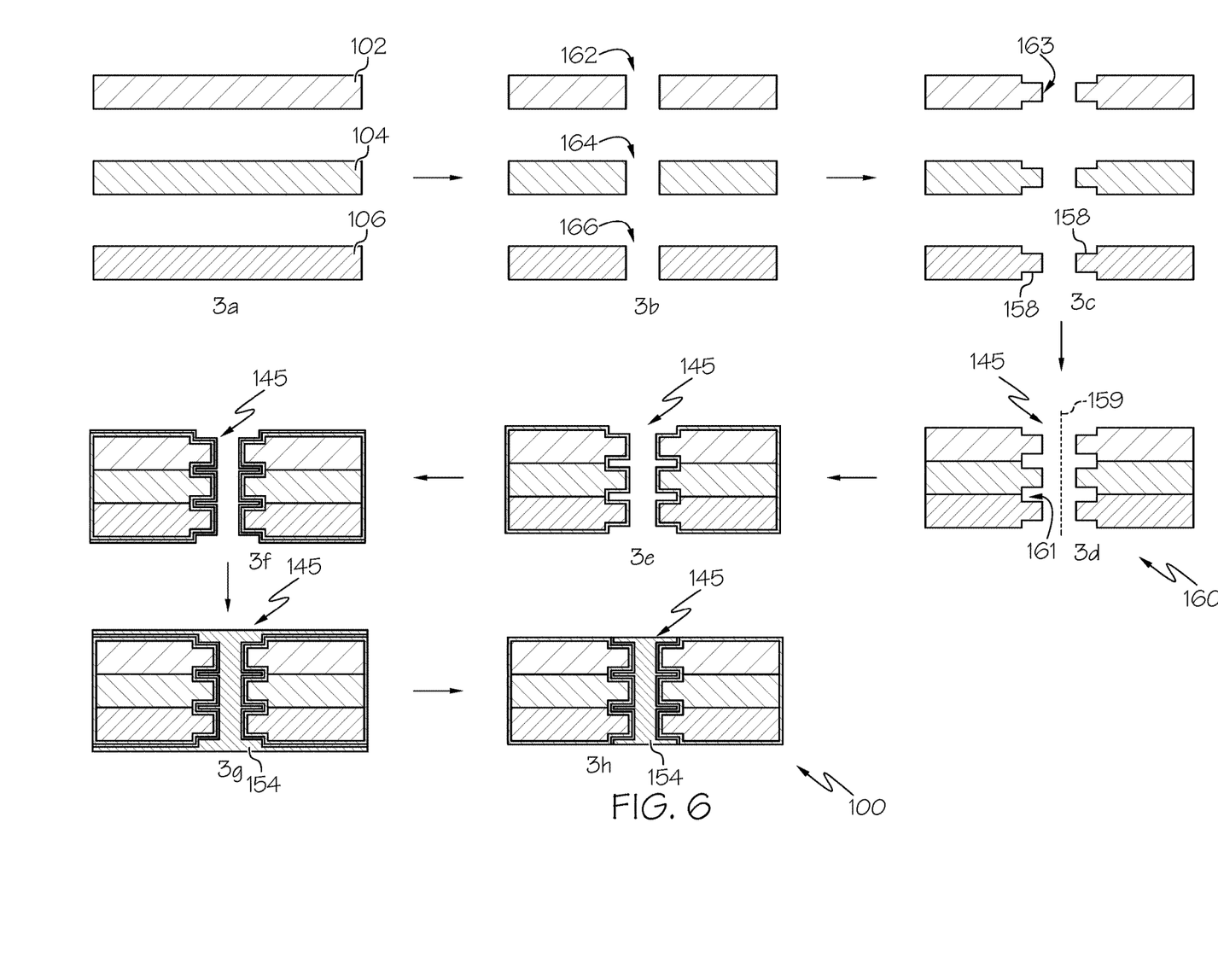
FIG. 6 schematically depicts a third example process for incorporating a TSV into the example multi-layer cooling structure of FIG. 1, according to one or more embodiments shown and described herein.

FIG. 6 schematically depicts features and another example method for forming a TSV that passes through a multi-layer substrate. The first, second, and third substrate layer through-holes 162, 164, 166 may be formed similarly as described with reference to FIG. 4 above in that they may be etched through each substrate layer individually at step 3b. Because each of the first, second, and third substrate layer through-holes 162, 164, 166 only needs to be etched through one substrate layer, the aspect ratio may be relatively low. However, rather than a straight profile etched through each of the first, second, and third substrate layers 102, 104, 106, the through-holes may include an alignment margin 158 that may be etched into the top surface and the bottom surface of the first, second, and third substrate layers 102, 104, 106 at step 3c. The alignment margin 158 is a clearance that provides additional space between the etched through-hole and the external surface of the substrate layer. In some embodiments, as shown in FIG. 6, the alignment margin 158 may be etched into both sides of the substrate layer. However, in some embodiments, the alignment margin 158 may be etched into only one side of each of the first, second, and third substrate layers 102, 104, 106.

When the substrate layers that include alignment margins 158 are directly bonded together at step 3d, one or more alignment gaps 161 are formed in the TSV sidewall 163 at the interface between the substrate layers. The insulation and passivation layer 155 (step 3e) and the seed layer 156 (step 3f) can then be added to the surfaces that make up the alignment gap 161 and the through-hole can be metallized to include a TSV 145 (step 3g) as described above. The multi-layer substrate 160 may then undergo a CMP process to complete the formation of the one or more TSVs 145.

Forming the alignment margin 158 in each substrate layer and thus the alignment gap 161 between substrate layers may ease tight alignment tolerances by effectively reducing the aspect ratio at each of the interfaces between substrate layers. Thus, discontinuities in the electrical signal passed through the TSV 145 are less likely. In some embodiments, ALD may be the preferred method of deposition.

Using the method illustrated by FIG. 6, there may not be a need for deep etching through the multiple layers of the multi-layer substrate 160 because the individual substrate layers may be etched before they are bonded. Thus, the fabrication procedure for TSVs of this sort may be relatively easier and faster than procedures requiring etching through bonded layers. Additionally, relatively stringent alignment tolerances may be relaxed because of the alignment margin 158. Through-holes that would otherwise not be in alignment have a tolerance that is at least equal to the radius of the alignment margin 158 rather than the smaller radius of the TSV sidewall 163. Thus, TSVs 145 produced by this procedure will have lower rates of electrical discontinuities for the same alignment costs, resulting in better connections between the semiconductor or other devices coupled by the TSVs.

It should now be understood that embodiments of the present disclosure are directed to multi-layer cooling structures including one or more TSVs through a plurality of directly-bonded substrates and methods of making the same. The through-holes etched through the multi-layer cooling structures fabricated according to the methods described herein may include one or more alignment margins and thus be less costly to align, making the multi-layer cooling structures easier to fabricate and making the TSVs through such through-holes less likely to contain electrical discontinuities. This may improve the current and/or signal strength between semiconductor devices through the one or more TSVs.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A multi-layer cooling structure comprising:
   a first substrate layer comprising an array of cooling channels;
   a second substrate layer comprising a nozzle structure that includes one or more nozzles, an outlet, and an outlet manifold;
   a third substrate layer comprising an inlet manifold and an inlet; and
   one or more TSVs disposed through the first substrate layer, second substrate layer, and third substrate layer, wherein at least one of the one or more TSVs is metallized; and wherein:
   the first substrate layer and the second substrate layer are directly bonded, and
   the second substrate layer and the third substrate layer are directly bonded.

2. The multi-layer cooling structure of claim 1, wherein:
   the first substrate layer comprises one or more first substrate layer through-holes,
   the second substrate layer comprises one or more second substrate layer through-holes, and
   the third substrate layer comprises one or more third substrate layer through-holes; and
   the one or more first substrate layer through-holes, the one or more second substrate layer through-holes, and the one or more third substrate layer through-holes are aligned to form the one or more TSVs.

3. The multi-layer cooling structure of claim 2, wherein the one or more first substrate layer through-holes, the one or more second substrate layer through-holes, and the one or more third substrate layer through-holes are concentrically aligned.

4. The multi-layer cooling structure of claim 2, wherein:
   the one or more first substrate layer through-holes have a larger radius than the one or more second substrate layer through-holes, and
   the one or more second substrate layer through-holes have a larger radius than the one or more third substrate layer through-holes.

5. The multi-layer cooling structure of claim 2, wherein the one or more first substrate layer through-holes, the one or more second substrate layer through-holes, and the one or more third substrate layer through-holes each comprise a different radius to provide a specific radial pattern along a height of the one or more TSVs.

6. The multi-layer cooling structure of claim 2, wherein the one or more first substrate layer through-hoes, the one or more second substrate layer through-holes, and the one or more third substrate layer through-holes each comprise alignment margins.

7. The multi-layer cooling structure of claim 6, wherein:
   a top surface and a bottom surface of the first substrate layer comprise alignment margins,
   a top surface and a bottom surface of the second substrate layer comprise alignment margins, and
   a top surface and a bottom surface of the third substrate layer comprise alignment margins.

8. The multi-layer cooling structure of claim 7, wherein:
   the alignment margins in the bottom surface of the first substrate layer and the alignment margins in the top surface of the second substrate layer are aligned at a first alignment gap, and
   the alignment margins in the bottom surface of the second substrate layer and the alignment margins in the top surface the third substrate layer are aligned at a second alignment gap.

9. The multi-layer cooling structure of claim 6, wherein:
   a bottom surface of the first substrate layer comprises an alignment margin,
   a top surface and a bottom surface of the second substrate layer comprises an alignment margin, and a top surface of the third substrate layer comprise alignment margins.

10. The multi-layer cooling structure of claim 1, wherein the one or more TSVs comprise a radius that decreases along a height of the one or more TSVs from a top surface of the first substrate layer to a bottom surface of the third substrate layer.

11. A multi-layer cooling structure that is thermally coupled to a semiconductor device comprising:
    a first substrate layer, a second substrate layer, and a third substrate layer,
    a first metallization pad directly coupled to a top surface of the first substrate layer and a second metallization pad directly coupled to a bottom surface of the third substrate layer, and
    one or more TSVs disposed through the first substrate layer, second substrate layer, and third substrate layer wherein at least one of the one or more TSVs is metallized; wherein
    the first substrate layer and the second substrate layer are directly bonded,
    the second substrate layer and the third substrate layer are directly bonded, and
    the one or more TSVs electrically couple the first metallization pad and the second metallization pad.

12. The multi-layer cooling structure of claim 11, wherein:
    the first substrate layer comprises one or more first substrate layer through-holes,
    the second substrate layer comprises one or more second substrate layer through-holes, and
    the third substrate layer comprises one or more third substrate layer through-holes; and
    the first substrate layer through-holes, the second substrate layer through-holes, and the third substrate layer through-holes are aligned to form the one or more TSVs.

13. The multi-layer cooling structure of claim 12, wherein the first substrate layer through-holes, the second substrate layer through-holes, and the third substrate layer through-holes each comprise a different radius to provide a specific radial pattern along a height of the one or more TSVs.

14. The multi-layer cooling structure of claim 13, wherein:
    a top surface and a bottom surface of the first substrate layer comprise alignment margins,
    a top surface and a bottom surface of the second substrate layer comprise alignment margins, and a top surface and a bottom surface of the third substrate layer comprise alignment margins.

15. The multi-layer cooling structure of claim 14, wherein:
the alignment margins in the bottom surface of the first substrate layer and the alignment margins in the top surface of the second substrate layer are aligned at a first alignment gap, and
the alignment margins in the bottom surface of the second substrate layer and the alignment margins in the top surface of the third substrate layer are aligned at a second alignment gap.

16. The multi-layer cooling structure of claim 11, wherein the one or more TSVs comprise a radius that decreases along a height of the one or more TSVs from a top surface of the first substrate layer to a bottom surface of the third substrate layer.

* * * * *